(12) United States Patent
Shimakawa et al.

(10) Patent No.: US 7,672,145 B2
(45) Date of Patent: Mar. 2, 2010

(54) ELECTRONIC COMPONENT MODULE

(75) Inventors: Junya Shimakawa, Sabae (JP); Hideyuki Fujiki, Echizen (JP); Keiji Ogawa, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/336,687

(22) Filed: Dec. 17, 2008

(65) Prior Publication Data
US 2009/0109637 A1 Apr. 30, 2009

Related U.S. Application Data

(63) Continuation of application No. PCT/JP2007/057939, filed on Apr. 11, 2007.

(30) Foreign Application Priority Data

Jun. 19, 2006 (JP) ............................. 2006-168669

(51) Int. Cl.
*H05K 9/00* (2006.01)
(52) U.S. Cl. .................. 361/816; 361/818; 361/800; 361/799; 361/753; 174/350; 174/377
(58) Field of Classification Search ............... 361/816, 361/818, 800, 799, 753; 174/350, 377; 333/167; 310/320
See application file for complete search history.

(56) References Cited

U.S. PATENT DOCUMENTS 5,172,077 A * 12/1992 Funada .................... 331/67
5,508,889 A * 4/1996 Ii ........................... 361/816
5,898,344 A * 4/1999 Hayashi .................. 331/67

(Continued)

FOREIGN PATENT DOCUMENTS

JP 2002-057234 A 2/2002

(Continued)

OTHER PUBLICATIONS

Official Communication issued in International Patent Application No. PCT/JP2007/057939, mailed on May 22, 2007.

*Primary Examiner*—Dameon E Levi
(74) *Attorney, Agent, or Firm*—Keating and Bennett, LLP

(57) ABSTRACT

An electronic component module includes a module body including a substrate having components mounted thereon. A metal case is attached to the substrate to cover the components of the module body. The metal case includes a top-plate portion arranged substantially parallel to the main surface of the substrate and claw portions arranged at both edges thereof. The claw portions each include a claw body defined by a rectangular portion that is bent at an edge of the top-plate portion and extends in the direction of the substrate and a holding claw. In addition, contacting portions are bent at both ends of the rectangular portion to extend towards the inner portion of the main surface of the substrate. The contacting portions come into contact with the main surface of the substrate, and the holding claws are soldered to the side surfaces of the substrate. Accordingly, it is possible to provide an electronic component module in which the proportion of a mounting area, in which components can be mounted, to a main surface of a substrate is increased, and in which positioning of a metal case can be easily performed.

3 Claims, 3 Drawing Sheets

U.S. PATENT DOCUMENTS

| | | | |
|---|---|---|---|
| 5,966,052 A * | 10/1999 | Sakai | 331/68 |
| 6,079,099 A * | 6/2000 | Uchida et al. | 29/837 |
| 6,687,135 B1 * | 2/2004 | Kitade | 361/816 |
| 6,694,610 B1 * | 2/2004 | Kitade | 29/840 |
| 6,760,227 B2 * | 7/2004 | Sakai et al. | 361/736 |
| 7,126,507 B2 * | 10/2006 | Lee | 341/118 |
| 7,190,982 B2 * | 3/2007 | Yamamoto et al. | 455/575.1 |
| 7,362,586 B2 * | 4/2008 | Mashimo et al. | 361/736 |
| 7,429,192 B2 * | 9/2008 | Liao et al. | 439/567 |
| 2001/0053070 A1 * | 12/2001 | Kitamura et al. | 361/818 |

FOREIGN PATENT DOCUMENTS

| | | |
|---|---|---|
| JP | 2003-078278 A | 3/2003 |
| JP | 2003-133786 A | 5/2003 |
| JP | 2003-152287 A | 5/2003 |

* cited by examiner

ELECTRONIC COMPONENT MODULE

BACKGROUND OF THE INVENTION

1. Field of the Invention

The present invention relates to an electronic component module. More specifically, the present invention relates to an electronic component module having a metal case arranged to cover components mounted on a substrate.

2. Description of the Related Art

FIG. 8 is a perspective view showing an example of a conventional electronic component module. An electronic component module 1 includes a substrate 2. The substrate 2 has a plurality of concave portions 3 on the edges thereof. Electrodes (not shown) are formed at these concave portions 3 and are connected to an electrode pattern (not shown) formed on a main surface of the substrate 2. Electronic components are mounted on the electrode pattern formed on the main surface of the substrate 2, thus forming a circuit. Then, a metal case 4 is attached to the substrate 2 so as to cover the mounted electronic components.

The metal case 4 includes a covering portion 5 that covers the mounted electronic components. Leg portions 6 are formed at an angle relative to the sides defining the corners of the covering portion 5. A foot 7 is formed at the tip of each leg portion 6 by bending the leg portion 6. Bonding electrodes 8 are formed at the four corners of the substrate 2, a n d the feet 7 are soldered to the bonding electrodes 8. In addition, a claw 9 formed of a long-claw portion 9a and short-claw portions 9b is formed on the metal case 4, which are used for positioning of the metal case 4. In this case, the relative position of the metal case 4 to the substrate 2 is determined by fitting the long-claw portion 9a to one of the concave portions 3 of the substrate 2. In addition, the distance between the mounting surface of the substrate 2 and the covering portion 5 of the metal case 4 is determined by the short-claw portions 9b in contact with the main surface of the substrate 2 at both sides of the concave portion 3 in which the long-claw portion 9a is fitted (refer to Japanese Unexamined Patent Application Publication No. 2002-57234).

However, demands for reduction in size of such electronic component modules are increasing, and it is required that a main surface of a substrate, which serves as a mounting surface for holding components thereon, be entirely used as a mounting area. Therefore, it is becoming difficult to secure spaces for bonding electrodes to which feet of a metal case are soldered and a space for a concave portion that receives a long-claw portion and permits short-claw portions to come into contact with the main surface of the substrate.

SUMMARY OF THE INVENTION

In view of the above, preferred embodiments of the present invention provide an electronic component module configured to have a larger mounting area in which components can be mounted, on a main surface of a substrate, and configured to enable easy positioning of a metal case.

A preferred embodiment of the present invention provides an electronic component module including a module body in which a component is mounted on a mounting surface of the substrate that is a main surface of a substrate, and a metal case arranged over the mounting surface of the substrate. The metal case includes a top-plate portion arranged parallel or substantially parallel to the mounting surface of the substrate to cover a mounting area in which the component is mounted, and claw portions to be fixed to the substrate, the claw portions arranged at at least two sides of the top-plate portion.

The claw portions each include a claw body to be arranged along a side surface of the substrate, the claw body is bent at an edge of the top-plate portion to extend towards the substrate, and a contacting portion of the claw body comes into contact with the main surface of the substrate, the contacting portion is bent at an edge of the claw body to extend towards an inner portion of the main surface of the substrate adjacently to the top-plate portion.

In such an electronic component module, it is preferable that the distance between a tip of the contacting portion and the side surface of the substrate be in the range from about 50 µm to about 250 µm, for example.

In addition, each of the claw portions may be defined by only the claw body and the contacting portion, and the metal case may be fixed to the module body by soldering nail bodies to the side surfaces of the substrate.

By arranging the claw bodies of the claw portions of the metal case along the side surfaces of the substrate to cause the contacting portions of the claw portions to come into contact with the main surface of the substrate, the metal case is positioned with respect to the substrate. At this time, only the contacting portions of the claw portions of the metal case are disposed on the main surface of the substrate. Furthermore, because the contacting portions are bent at the edges of the claw bodies and extend towards the inner portion of the main surface of the substrate, even if the edges of the substrate are linear, the contacting portions can come into contact with the main surface of the substrate. Accordingly, there is no need to provide concave portions on the edges of the substrate, whereby the proportion of the mounting area, in which components can be mounted, to the main surface of the substrate, is increased. Therefore, even if the size of the substrate is reduced, multiple components can be mounted thereon, whereby a compact electronic component module can be obtained. In addition, because the distance between the main surface of the substrate and the top-plate portion of the metal case can be determined by the contacting portions, occurrence of failure due to sinking of the metal case can be avoided.

If the distance between the tips of the contacting portions and the side surfaces of the substrate is in the range from about 50 µm to about 250 µm, for example, the contacting portions can come into contact with the main surface of the substrate, and a mounting area of the components can be increased without causing the contacting portions to extend excessively towards an inner portion of the main surface of the substrate.

By providing each of the claw portions with the claw body and the contacting portion, only the contacting portions are disposed on the main surface of the substrate. Thus, the mounting area for components can be increased. In addition, by soldering the claw bodies to the side surfaces of the substrate, there is no need to provide leg portions and the like to fix the metal case at the other edges of the top-plate portion or to secure fixing spaces of the leg portions on the main surface of the substrate. Thus, it is possible to increase the mounting area for components on the substrate.

According to a preferred embodiment of the present invention, because only the contacting portions of the metal case are disposed on the main surface of the substrate, the positioning space required by the metal case can be reduced. Therefore, it is possible to increase the proportion of the mounting area, in which components can be mounted, to the main surface of the substrate and obtain a small electronic component module. Furthermore, the metal case can be easily positioned merely by being placed over the main surface of the substrate with the claw bodies of the claw portions thereof slid along the side surfaces of the substrate until the contacting portions come into contact with the main surface of the substrate. In addition, because the contacting portions are in contact with the main surface of the substrate, an occurrence of failure due to sinking of the metal case can be avoided. Further, by soldering the claw bodies of the metal case to the side surfaces of the substrate, there is no need to provide leg portions and the like at the other edges of the top-plate portion, whereby the mounting area on the substrate can be increased.

These and other features, elements, characteristics, arrangements and advantages of the present invention will become clearer from the following description of preferred embodiments thereof with reference to the drawings.

DETAILED DESCRIPTION OF THE PREFERRED EMBODIMENTS

Figure 1:
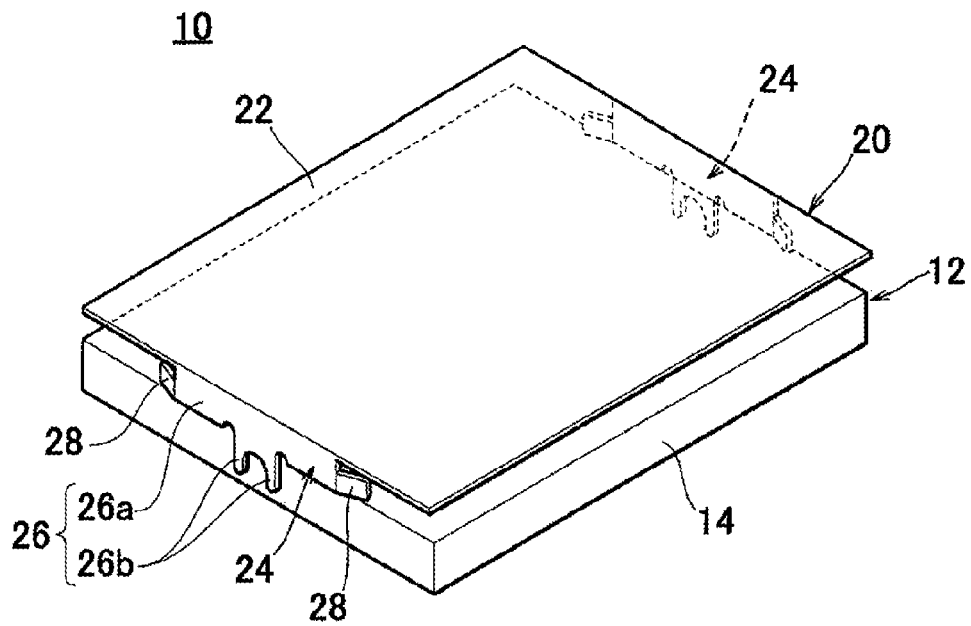
FIG. 1 is a perspective view showing an example of an electronic component module according to a preferred embodiment of the present invention.
Figure 2:
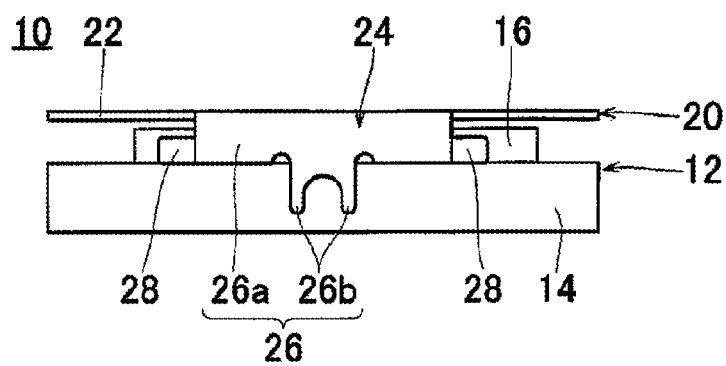
FIG. 2 is a side view of the electronic component module show in FIG. 1.
Figure 3:
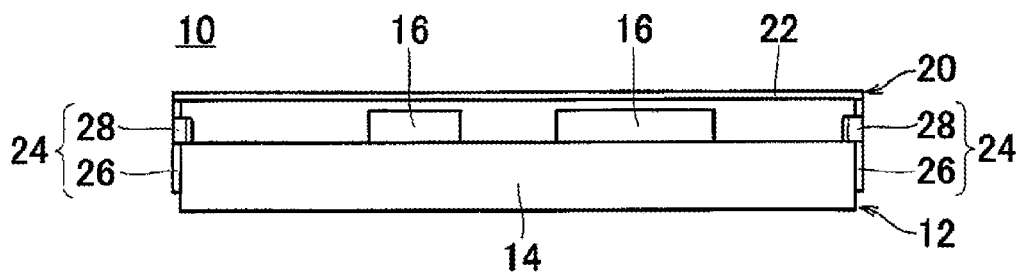
FIG. 3 is a side view of the electronic component module show in FIG. 1, seen from another direction different from FIG. 2.
Figure 4:
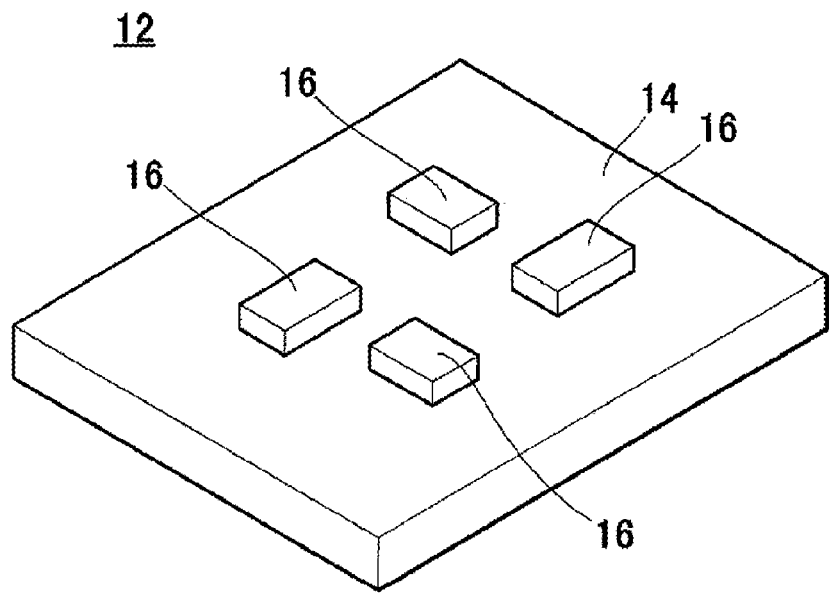
FIG. 4 is a perspective view of a module body used in the electronic component module shown in FIG. 1.

FIG. 1 is a perspective view showing an example of an electronic component module according to a preferred embodiment of the present invention. FIGS. 2 and 3 are side views of the electronic component module shown in FIG. 1, seen from different aspects. An electronic component module 10 includes a module body 12. The module body 12 includes a substrate 14 that is preferably rectangular or substantially rectangular, for example. A multilayer ceramic substrate or a plastic substrate, for example, is preferably used as the substrate 14. As shown in FIG. 4, components 16 are mounted on a main surface of the substrate 14, and the mounted components 16 are connected to each other through an electrode pattern (not shown) arranged on the main surface of the substrate 14. Thus, a circuit is defined.

Figure 5:
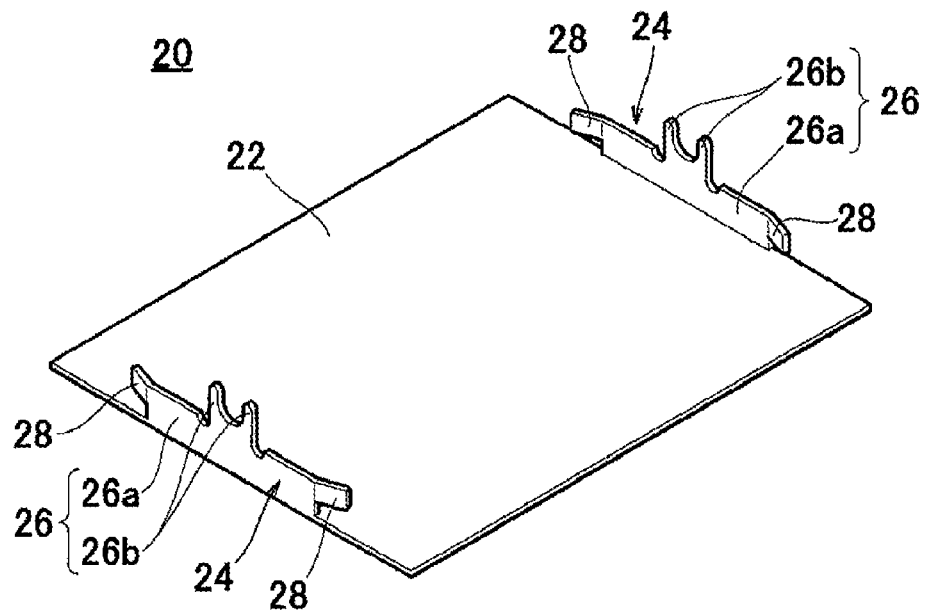
FIG. 5 is a perspective view of a metal case used in the electronic component module shown in FIG. 1.

To the module body 12, a metal case 20 serving as a conductive shielding case is attached over the main surface of the substrate 14 having the components 16 mounted thereon. The metal case 20 includes, as shown in FIG. 5, a rectangular or substantially rectangular top-plate portion 22 that is substantially the same size as the main surface of the substrate 14. Claw portions 24 are provided at both edges in a longitudinal direction of the top-plate portion 22. The claw portions 24 each include a claw body 26 that extends perpendicularly or substantially perpendicularly to the top-plate portion 22. The claw body 26 includes a rectangular portion 26a that extends from the top-plate portion 22 perpendicularly or substantially perpendicularly and a holding claw 26b that extends from the central portion of the rectangular portion 26a in the opposite direction from the top-plate portion 22. The holding claw 26b is preferably bifurcated, for example, and is arranged to continuously extend from the rectangular portion 26a that is bent at the top-plate portion 22.

In addition, the claw portions 24 each include contacting portions 28. The contacting portions 28 are bent at both edges in the longitudinal direction of the rectangular portion 26a to extend towards the inner portion of the top-plate portion 22 adjacently to the top-plate portion 22. The contacting portions 28 are arranged perpendicularly or substantially perpendicularly to the top-plate portion 22 with a gap therebetween. The metal case 20 is formed by, for example, punching a flat plate in the shape of the unfolded top-plate portion 22 and the claw portions 24 out of a metal plate, and the claw bodies 26 and the contacting portions 28 are formed by bending such a metal plate.

Figure 6:
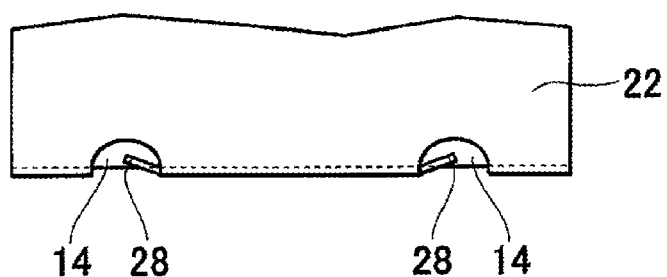
FIG. 6 is a schematic view showing the relationship between contacting portions of the metal case and the substrate of the module body according to a preferred embodiment of the present invention.

The metal case 20 is attached to the main surface of the substrate 14 such that the top-plate portion 22 covers the mounting area in which the components 16 are mounted. At this time, by placing the metal case 20 over the substrate 14 with the claw portions 24 at the front against the substrate 14, the holding claws 26b move along the side surfaces at both ends in the longitudinal direction of the substrate 14. Because the contacting portions 28 are arranged such that they extend from both ends of each rectangular portion 26a towards the inner portion of the top-plate portion 22, the contacting portions 28 are arranged such that they extend towards the inner portion of the main surface of the substrate 14. Accordingly, as shown in FIG. 6, the contacting portions 28 come into contact with the main surface of the substrate 14. FIG. 6 shows the top-plate portion 22 in a partially cut-away state so that the state of the contacting portions 28 can be viewed. As shown, by the contacting portions 28 in contact with the main surface of the substrate 14, the metal case 20 is positioned. In other words, the position of the metal case 20 relative to the substrate 14 is determined by arranging the holding claws 26b on both edges of the top-plate portion 22 to extend along the side surfaces of the substrate 14. In addition, the distance between the main surface of the substrate 14 and the top-plate portion 22 is determined by bringing the contacting portions 28 into contact with the main surface of the substrate 14. Thus, the top-plate portion 22 is arranged parallel or substantially parallel to the mounting surface of the substrate 14, on which the components 16 are mounted.

Figure 7:
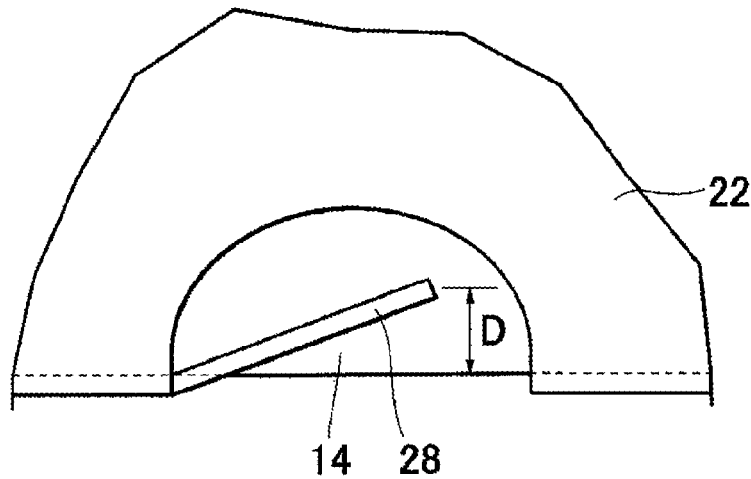
FIG. 7 is an enlarged view showing the relationship between the contacting portions and the substrate, shown in FIG. 6.
Figure 8:
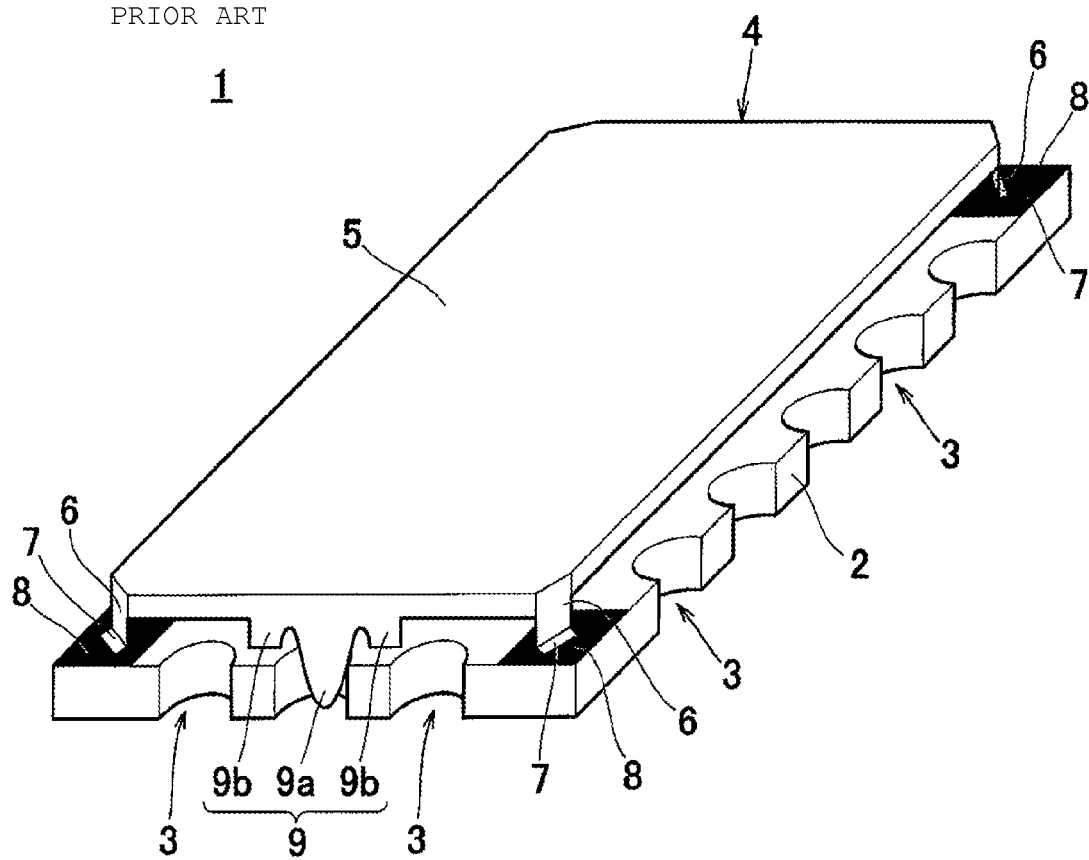
FIG. 8 is a perspective view showing an example of a conventional electronic component module.

At this time, as shown in FIG. 7, the distance D between the tips of the contacting portions 28 and the side surface of the substrate 14 facing thereto is preferably in the range from about 50 μm to about 250 μm, for example. The holding claws 26b are soldered to the side surfaces of the substrate 14. Because the holding claws 26b of this metal case 20 are bifurcated, solder flows inside the holding claws 26b. Thus, the substrate 14 is fixed to the metal case 20 with great holding power. The side surfaces of the substrate 14 are preliminarily provided with electrodes (not shown) to which the holding claws 26b are to be soldered. The electrodes to which the holding claws 26b are to be soldered may be connected to, for example, a ground electrode (not shown) arranged on the other main surface of the substrate 14. In such a case, the metal case 20 is connected to the ground electrode by soldering the holding claws 26b to the electrodes on the side surfaces of the substrate 14.

In the electronic component module 10, the metal case 20 covers the components 16 mounted on the main surface of the substrate 14. The metal case 20 is positioned on the substrate 14 by the claw portions 24. In other words, the claw portions 24 determine the relative position of the metal case 20 to the substrate 14. The claw bodies 26 of the claw portions 24 are arranged to extend along the side surfaces at both edges in the longitudinal direction of the substrate 14 and are fixed by soldering the holding claws 26b to the side surfaces of the substrate 14. Accordingly, there is no need to provide leg portions and the like for fixing the metal case 20 to the substrate at the other edges of the top-plate portion 22, and there is no need to form electrodes on the main surface of the substrate 14 for soldering of the metal case 20.

In addition, the distance between the main surface of the substrate 14 and the top-plate portion 22 of the metal case 20 is determined by bringing the contacting portions 28 of the metal case 20 into contact with the main surface of the substrate 14. Because the contacting portions 28 are bent so as to extend from both ends of the rectangular portion 26a of each claw body 26 toward the inner portion of the top-plate portion 22, even if the side surfaces of the substrate 14 are linear, the contacting portions 28 can come into contact with the main surface of the substrate 14. Because the contacting portions 28 can come into contact with the main surface of the substrate 14 in this way, there is no need to provide concave portions or the like in the substrate 14. Accordingly, the space required to position the metal case 20 on the main surface of the substrate 14 is small. In particular, by preferably setting the distance between the tips of the contacting portions 28 and the side surfaces of the substrate 14 in the range from about 50 µm to about 250 µm, for example, the contacting portions 28 can assuredly come into contact with the main surface of the substrate 14, and further, the area used for positioning can be minimized. Accordingly, the metal case 20 does not sink too much toward the substrate 14, whereby the occurrence of a failure due to sinking of the metal case 20 can be minimized.

Thus, in the electronic component module 10, there is no need to provide concave portions for positioning the metal case 20 in the substrate 14. Furthermore, because there is no need to solder the metal case 20 to the main surface of the substrate 14, the space required to attach the metal case 20 can be reduced. Accordingly, the proportion of the mounting area for the components 16 to the entire main surface of the substrate 14 can be increased. In other words, if the same components 16 are to be mounted, the electronic component module 10 can be made smaller than a conventional product. Thus, in the electronic component module 10, attachment failure of the metal case 20 is unlikely to happen, and a reduction in size is possible.

Although it has been described that the claw portions 24 are preferably provided at both edges in the longitudinal direction of the top-plate portion 22 and that the metal case 20 is fixed at both edges in the longitudinal direction of the substrate 14, the claw portions 24 may be provided at three sides or four sides of the top-plate portion 22. By providing the claw portions 24 at two or more sides of the top-plate portion 22, the holding claws 26b can be soldered to two or more side surfaces of the substrate 14, thereby increasing the accuracy in positioning the metal case 20. In such a case too, the presence of the contacting portions 28 minimizes the required area on the substrate 14 for the positioning of the metal case 20.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component module comprising:
   a module body including a component mounted on a mounting surface of a substrate that is a main surface of a substrate; and
   a metal case arranged over the mounting surface of the substrate; wherein
   the metal case includes a top-plate portion arranged substantially parallel to the mounting surface of the substrate and so as to cover a mounting area in which the component is mounted, and claw portions arranged to be directly fixed to the substrate, the claw portions being provided at at least two sides of the top-plate portion; and
   the claw portions each include a claw body arranged along a side surface of the substrate, the claw body being bent at an edge of the top-plate portion so as to extend towards the substrate, and a contacting portion arranged to contact with the main surface of the substrate, the contacting portion is directly connected to and bent at an edge of the claw body to extend towards an inner portion of the main surface of the substrate adjacently to the top-plate portion.

2. The electronic component module according to claim 1, wherein the distance between a tip of the contacting portion and the side surface of the substrate is in a range from about 50 µm to about 250 µm.

3. The electronic component module according to claim 1, wherein each of the claw portions includes only the claw body and the contacting portion, and the metal case is fixed to the module body by solder provided between the claw bodies and the side surfaces of the substrate.

* * * * *